United States Patent [19]
Ishii et al.

[11] Patent Number: 5,468,112
[45] Date of Patent: Nov. 21, 1995

[54] WAFER CONTAINER AND WAFER ALIGNING APPARATUS

[75] Inventors: Katsumi Ishii, Kanagawa; Masao Takikawa, Sagamihara, both of Japan

[73] Assignees: Tokyo Electron Limited, Tokyo; Tokyo Electron Tohoku Limited, Esashi, both of Japan

[21] Appl. No.: 131,391

[22] Filed: Oct. 5, 1993

[30] Foreign Application Priority Data

Oct. 5, 1992 [JP] Japan ................................. 4-288194
Oct. 5, 1992 [JP] Japan ................................. 4-288195

[51] Int. Cl.⁶ .................................................. G01P 13/00
[52] U.S. Cl. ........................... 414/416; 414/936; 414/937; 414/940; 414/217; 414/754; 414/939; 414/757; 118/719; 118/500
[58] Field of Search ................................. 414/417, 404, 414/743, 403, 225, 331, 416, 935, 936, 937, 938, 939, 940, 941, 754, 757, 680; 204/298.25; 118/719, 500

[56] References Cited

U.S. PATENT DOCUMENTS

| | | | |
|---|---|---|---|
| 4,744,715 | 5/1988 | Kawabata | 414/937 X |
| 4,778,331 | 10/1988 | Kimata et al. | 414/936 X |
| 4,895,486 | 1/1990 | Baker et al. | 414/217 X |
| 5,048,164 | 9/1991 | Harima | 414/940 X |
| 5,064,337 | 11/1991 | Asakawa et al. | 414/940 X |
| 5,181,819 | 1/1993 | Sukata et al. | |
| 5,183,378 | 2/1993 | Asano et al. | 414/936 X |

FOREIGN PATENT DOCUMENTS

| | | | |
|---|---|---|---|
| 273441 | 12/1986 | Japan | 414/416 |
| 140523 | 6/1988 | Japan | 414/940 |
| 178948 | 7/1990 | Japan | 414/940 |
| 270253 | 12/1991 | Japan | 414/936 |
| 154144 | 5/1992 | Japan | 414/937 |

Primary Examiner—Frank E. Werner
Attorney, Agent, or Firm—Oblon, Spivak, McClelland, Maier & Neustadt

[57] ABSTRACT

A container for storing a plurality of semiconductor wafers comprises two end walls and two side walls. The container has a main opening through which the wafers are inserted into or withdrawn from the container and a sub-opening through which a wafer counter approaches the wafers. A plurality of slots are formed in the container to hold the wafers one by one at intervals. Each slot includes a pair of grooves which are formed in inner surfaces of both the side walls, have a V-shaped cross-section, and which divergently open toward a central portion of the container. One surface of each groove serves as a supporting surface on which a wafer is disposed substantially horizontal when the container is positioned such that the reference plane is horizontal. The supporting surfaces of the pair of grooves have a pair of converging portions which converge toward the second opening. A filling body, having an inner surface which is brought into contact with an edge portion of a wafer, is provided in each converging portion near the sub-opening. The inner surface of the filling body is determined so as to restrict a position of the wafer, such that the wafer can be positioned at the same height of the supporting surfaces of the pair of grooves.

12 Claims, 9 Drawing Sheets

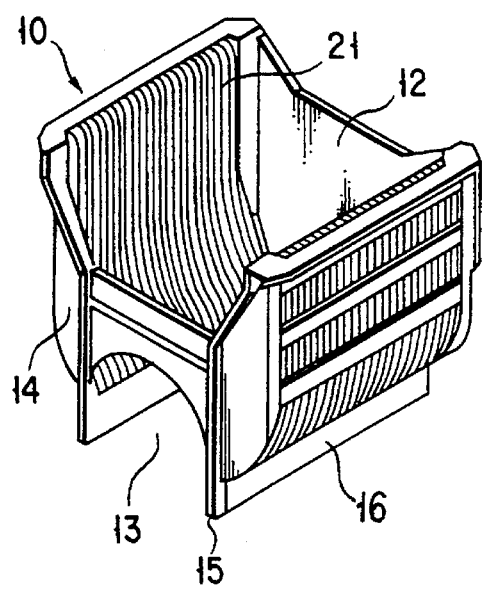
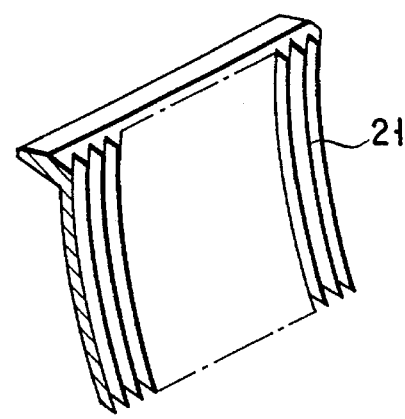
FIG. 7          FIG. 8
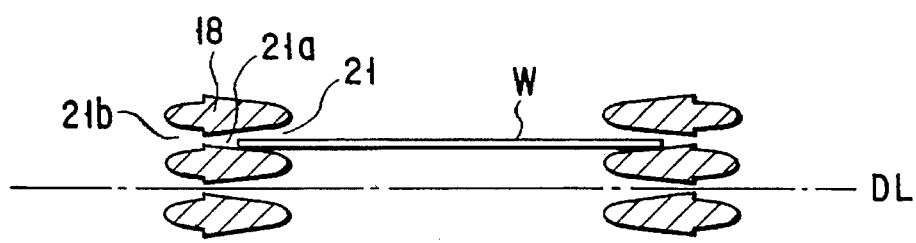
FIG. 9A
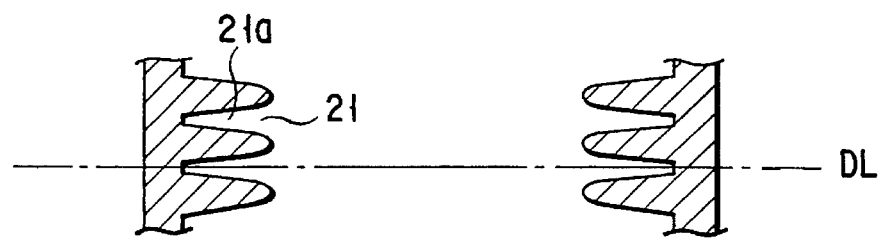
FIG. 9B

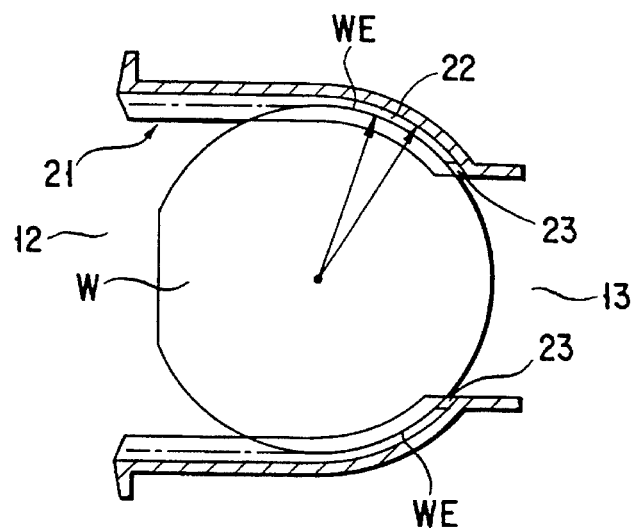
FIG. 10
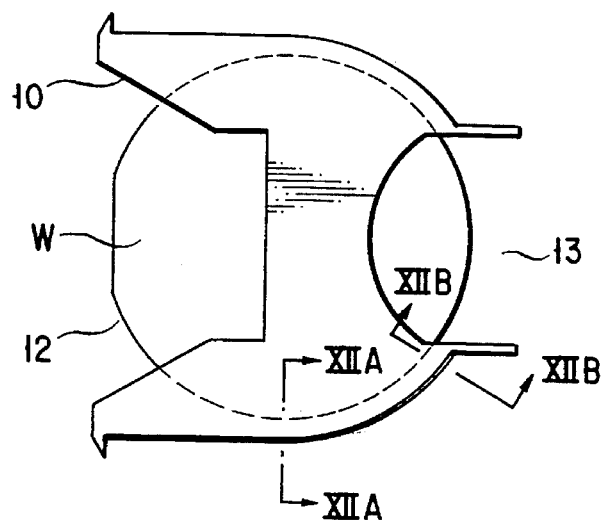
FIG. 11
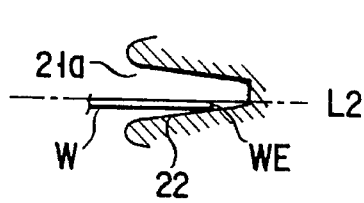 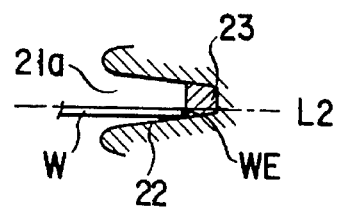
FIG. 12A    FIG. 12B

WAFER CONTAINER AND WAFER ALIGNING APPARATUS

BACKGROUND OF THE INVENTION

1. Field of the Invention

The present invention relates to a wafer container in which a plurality of wafers made of semiconductor, quartz, or glass are arranged at intervals, and an apparatus for aligning the wafers stored in the container.

2. Description of the Related Art

In a process of manufacturing semiconductor devices, various heat treatments are carried out for oxidation, diffusion, CVD, annealing, etching and so forth. In these steps, a container 2 as shown in FIG. 1 for storing a plurality of wafers at intervals is used to transfer the wafers near a processing apparatus.

The wafer container 2 has a main opening 3 through which wafers W are inserted therein and a sub-opening 4 which is smaller than the main opening 3. The wafers W are approached through the sub-opening 4 by an apparatus for aligning orientation flats OF of the wafers W and counting the number of the wafers W. The aligned orientation flats OF can stay on the side of the sub-opening 4 or moved to the side of the main opening 3.

A number of holding slots 5 for holding the wafers W are formed parallel with one another on the inner surfaces of the container 2. Each slot has a pair of opposing grooves formed on the inner surfaces of the container 2. Each groove has a V-shaped cross-section which divergently opens toward the inside of the container 2 as shown in FIG. 2, so that a wafer can easily be inserted therein. Hence, when the container 2 is placed so as to hold the wafers w substantially horizontally, each wafer w is supported by a tapered supporting surface 6 which corresponds to a side of a V-shaped slot 5. When the container 2 is placed so as to hold the wafers W substantially vertical, each wafer W is supported by both sides of the sub-opening 4 in a state where the side or the edge of the wafer W abuts on the innermost part of the V-shaped slot 5.

However, even if the container having V-shaped slots is placed such that wafers w are supported substantially horizontal, the wafers w cannot be completely horizontal and somewhat slant at various angles. More specifically, when a wafer w is inserted in a slot 5, an edge WE of the wafer W does not reach the innermost part of the groove at a position shown in FIG. 4A, which shows a cross section taken along the line IVA—IVA in FIG. 3, since a clearance 7 of about 1 to 2 mm is provided in this position to easily insert or withdraw the wafer W into or from the slot. In contrast, at a position shown in FIG. 4B, which shows a cross section taken along the line IVB—IVB in FIG. 3, the edge WE of the wafer W reaches the innermost part of the groove. For this reason, the upper surface of the wafer W, which has an uniform thickness, is located at a level L1 in the position corresponding to the line IVB—IVB and below the level L1 in the position corresponding to the line IVA—IVA. In short, the wafer W slants to the main opening 3 slightly downward as shown in FIG. 5A. FIG. 5A is an emphasized view in which the ratio of the height to the width is about ten times larger than the real. Although the wafers W are shown to partly overlap with projecting portions of container 2 which are shown with hatching in FIG. 5A, the wafers have an outline or width in a plan view, which becomes narrower gradually toward the main opening 3 of the container 2, and thus do not interfere with any part of the slots 5.

In the inclined state as described above, when an arm 8 (FIGS. 6A and 6B) for transferring wafers W is inserted between two wafers, an end of the arm 8 may be in contact with the wafers and damage them. When the slot 5 is slanted to make the wafers w more horizontal, as shown in FIG. 5B, the wafers tend to be brought into contact with the ceiling surfaces of the slots 5, resulting in damage of the wafers.

Further, the front edges of wafers W stored in the container 2 are not completely aligned, as shown in FIGS. 6A and 6B, due to less accurate dimensions in manufacturing the container 2. This positional variation of wafers W occurs particularly when the container 2 is rotated from a substantially vertical state to a substantially horizontal state. The positional variation causes misarrangement of wafers when the wafer W are transferred to a wafer boat or the like.

The larger the size (6 inches or 8 inches) of the wafers, the more serious the above problem.

SUMMARY OF THE INVENTION

An object of the present invention is to provide a container which can hold a plurality of wafers accurately horizontal.

Another object of the present invention is to provide an apparatus for aligning a plurality of wafers in cooperation with a container so that the fronts of the wafers are aligned.

According to the present invention, a container for storing a plurality of substantially circular wafers, comprises:

first and second end walls opposite to each other, the first end wall having a reference plane;

first and second side walls opposite to each other and connecting the first and second end walls;

a first opening defined by the first and second end walls and the first and second side walls, the first opening serving as an opening through which the wafers are inserted in or withdrawn from the container;

a second opening defined by the first and second end walls and the first and second side walls, the second opening being opposite to the first opening and smaller than the first opening; and a plurality of slots for holding the wafers one by one at intervals, each slot including a pair of grooves which are formed in inner surfaces of both the side walls, have a V-shaped cross-section, and divergently open toward a central portion of the container, one of surfaces defining each groove serving as a supporting surface on which a wafer is disposed substantially horizontal when the container is positioned such that the reference plane is placed on a horizontal plane, the supporting surfaces of the pair of grooves having a pair of converging portions which converge toward the second opening.

In a first aspect of the invention, the container further comprises a pair of contact surfaces which are respectively brought into contact with sides of each of the wafers held by the slots, each contact surface being formed on the converging portion of each supporting surface and restricting the position of each wafer so that the wafer is positioned at the same height on the supporting surfaces of the pair of grooves.

In a second aspect of the invention, the container further comprises a pair of raising bodies formed on the supporting surfaces of the pair of grooves, and forming one surface level parallel to the reference plane and brought into contact with a lower surface of the wafer held by each slot, each raising body having first and second portions respectively provided on sides of the first and second openings with a radial extension line passing through a center of gravity of the wafer held by each slot interposed between the first and second portions.

In a third aspect of the invention, the container is formed such that, in relation to a plane pallalel to the reference plane, each supporting surface forms an angle of about 1° to 3°, and another surface of each groove, which is opposite to the supporting surface, formes an angle of about 9° to 15°.

In a fourth aspect of the invention, the reference plane of the first end wall functions as a first reference plane, and the container further comprises a frame formed on both sides of the second opening and having a second reference plane. In the fourth aspect, there is provided an apparatus for simultaneously aligning the wafers stored in the container, comprising:

a first plate, which is brought into contact with the second reference plane, and on which the container is mounted so that the second reference plane is horizontal; a second plate, which is perpendicular to the first plate, and which faces the first reference plane when the container is mounted on the first plate; attitude converting means for substantially 90° rotating the first and second plates together, thereby converting a state in which the container is mounted on the first plate into a state in which the container is mounted on the second plate and the first reference plane is horizontal; and restricting means inserted through the second opening into the container and brought into contact with sides of the wafers so as to simultaneously move the wafers toward the first opening, the restricting means being brought into contact with the sides of the wafers on one plane.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a perspective view showing a wafer container according to the present invention;

FIG. 8 is a perspective view showing part of an inner surface of a side wall of the container shown in FIG. 7;

FIG. 9A is a cross-sectional view showing details of the side wall of the container shown in FIG. 7;

FIG. 9B is a cross-sectional view showing details of a modification of the side wall of the container shown in FIG. 7;

FIG. 10 is a transversal cross-sectional view showing a slot of a container according to a first embodiment of the present invention;

FIG. 11 is a plan view showing a state in which a wafer is contained in the container according to the first embodiment of the present invention;

FIGS. 12A and 12B are cross-sectional views respectively taken along the lines XIIA—XIIA and XIIB—XIIB in FIG. 11;

DETAILED DESCRIPTION OF THE PREFERRED EMBODIMENTS

Figure 1:
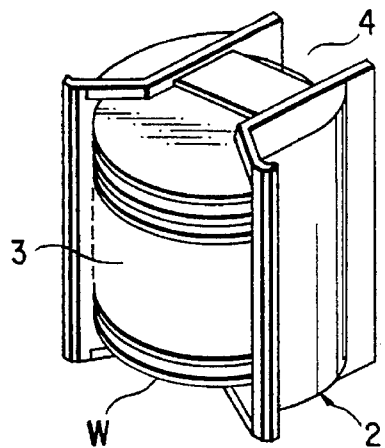
FIG. 1 is a perspective view showing a conventional wafer container.
Figure 2:
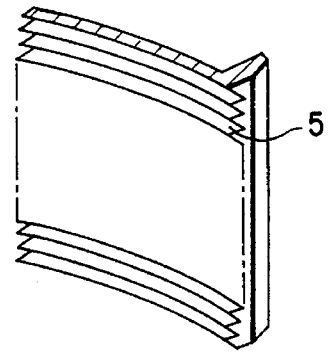
FIG. 2 is a perspective view showing part of an inner surface of a side wall of the container shown in FIG. 1.

FIG. 7 is a perspective view showing a container for storing semiconductor wafers according to the present invention. A container 10 is integrally formed of a resin mold product such as PFA (tetrafluoroethylene/perfluoroalkyl-vinylether copolymer) or PP (polypropylene), or SiC (silicon carbide). The container 10 has a main opening 12 through which wafers W are inserted and a sub-opening 13 which is smaller than the main opening 3. The wafers W are approached through the sub-opening 13 by an apparatus for aligning orientation flats OF of the wafers W and counting the number of the wafers W. The aligned orientation flats OF may be kept on the side of the sub-opening 13 or moved to the side of the main opening 12.

A number of holding slots 21 for holding the wafers W are formed parallel with one another on the inner surfaces of the container 10. A normal container is capable of storing 25 wafers. Both side walls of the container 10 are defined by a number of fins 18, between which a slot 21 is formed. The fins 18, i.e., both side walls of the container 10 are convergently curved from the main opening 12 toward the sub-opening 13. The fins 18 are connected to a body frame of the container 10 at several portions including both end portions thereof. Each slot 21 has a pair of grooves 21a formed in inner surfaces of both sides of the container 10 so as to extend from the main opening 12 to the sub-opening 13. The grooves 21a are symmetric and face each other with an interior space interposed therebetween. Each groove 21a has a V-shaped cross-section which divergently opens toward the inside of the container as shown in FIG. 8, so that a wafer can easily be inserted therein. The angle of the V-shaped groove is set 12° to 16°. As shown in FIG. 9A, the groove 21a communicates with a groove 21b of the exterior surface of the container through a slit substantially over the entire length of the fin 18. The slot 21 can be formed as shown in FIG. 9B, in which the groove does not communicates with the exterior of the container through any slit.

A protrusion pattern 15 is formed on at least one of the end walls 14 of the container 10. The protrusion pattern 15 is utilized when the container 10 is handled. The ridge of the protrusion pattern 15 lies on one plane, which constitutes a first reference plane. In other words, when the container 10 is placed on a horizontal plane using the end wall 14 including the protrusion 15 as a bottom, a ½ divisional line DL (FIGS. 9A and 9B) of the groove 21a of the slot 21 is horizontal. The ½ divisional line DL divides the angle 12° to 16° of the V-shaped groove 21a into two equal parts.

Legs 16 are formed on both sides of the sub-opening 13. The legs 16 are also utilized when the container 10 is handled. The lower end sides or the ridges of the legs 16 lie on one plane, which constitutes a second reference plane. In other words, when container 10 is placed on a horizontal plane using the legs 16 as a bottom, the ½ divisional line DL of the groove 21a of the slot 21 is vertical.

FIG. 10 is a transversal cross-sectional view showing a slot 21 of the container 10 according to a first embodiment of the present invention. When the container 10 is placed such that a wafer W is substantially horizontal, the wafer W is supported by a supporting surface 22 which corresponds to one side of the V-shaped slot 21. In this state, the supporting surface, in a plan view, extends in a straight line on the side of the main opening 12 and circularly curved on the side of the sub-opening 13. In a sectional view, the supporting surface is tapered downward.

Fillings 23 are provided in the pair of grooves 21a constituting the slot 21, adjacent to both sides of the sub-opening 13 of the container 10.

The positions of the surfaces of the fillings 23 which face to the grooves 21a are determined such that a wafer W is completely horizontal when the container 10 is placed on a horizontal plane using the end wall 14 (the first reference plane) as the bottom. More specifically, when the wafer W is stored in the slot 21 as shown in FIGS. 10 and 11 and the side or the edge WE of the wafer W abuts on the fillings 23, the wafer W is placed at the same height on portions of the supporting surface 22. For example, the wafer W is placed at the same height on the portions corresponding to the line XIIA—XIIA and the line XIIB—XIIB (FIG. 11), cross-sectional views of which are respectively shown in FIGS. 12A and 12B, so that the upper surface of the wafer W coincides with a level L2.

Figure 3:
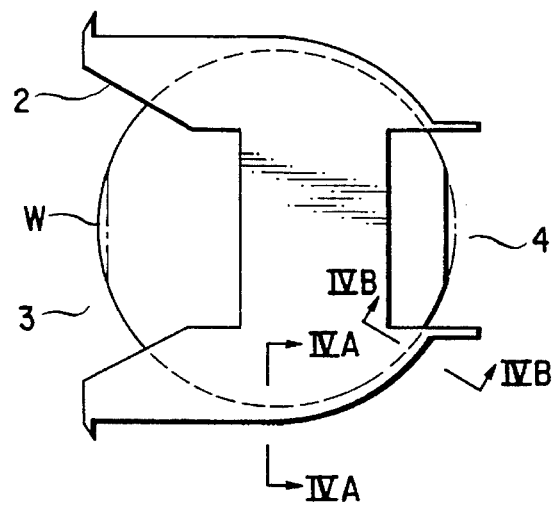
FIG. 3 is a plan view showing a state in which a wafer is contained in the container shown in FIG. 1.
Figure 4A:
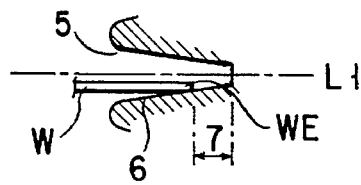
FIGS. 4A and 4B are cross-sectional views respectively taken along the lines IVA—IVA and IVB—IVB in FIG. 3.
Figure 4B:
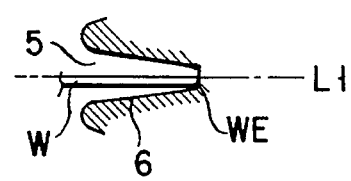
Figure 5A:
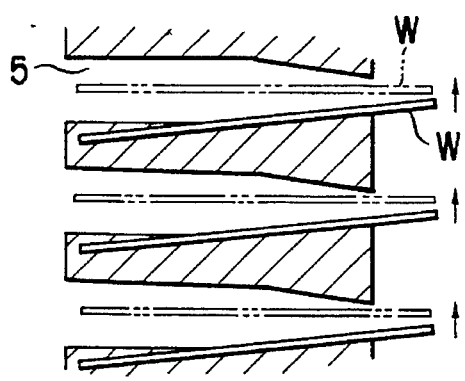
FIGS. 5A and 5B are longitudinal cross-sectional views showing states in which wafers are contained in the container shown in FIG. 1.
Figure 5B:
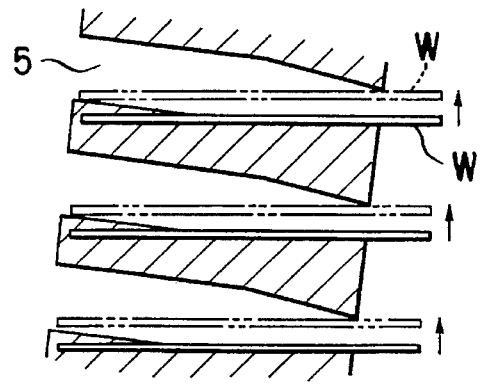

This function of the container 10 can be more clarified when compared with that of the conventional container 10 shown in FIGS. 4A and 4B. In the conventional container, since no filling is provided, the edge WE reaches the innermost portion of the groove in the portion corresponding to the line IVB—IVB in FIG. 3. Hence, the upper surface of the wafer W is on the level L1 in the portion corresponding to the lines IVB—IVB, resulting in a slant of the wafer W.

In contrast, according to the present invention, the wafer W can be placed at the same height on portions of the supporting surface 22 by a simple structure of the fillings 23, which function as wafer contact portions. In other words, when the container 10 is placed on a horizontal plane using the end wall 14 (the first reference plane) as the bottom, the wafer W is completely horizontal.

The positions of the fillings 23 are not limited to the portions adjacent to both sides of the sub-opening 13, but can be variously changed so long as the inner surfaces of the fillings 23 exist in a region in which the supporting surfaces 22 converge toward the sub-opening 13. Further, in this embodiment, when the edge WE of the wafer is brought into contact with the inner surface of the fillings 23, the outline of the wafer W is concentric with the outline of the supporting surface 22. However, the wafer W can be placed at the same height on portions of the supporting surface 22, even if these outlines are not concentric as shown in FIG. 13.

Figure 13:
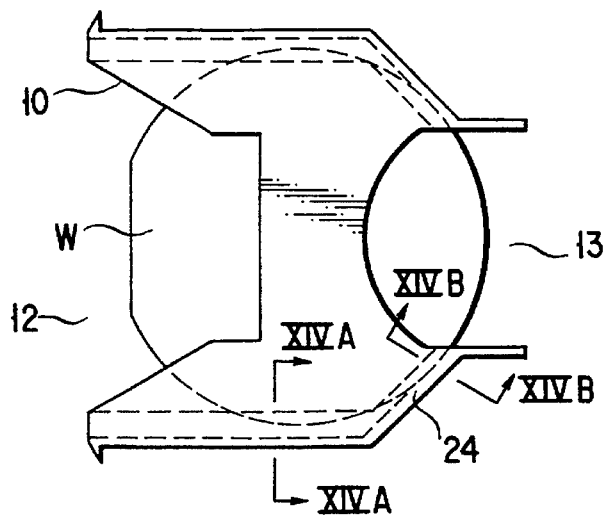
FIG. 13 is a plan view showing a state in which a wafer is contained in the container according to a second embodiment of the present invention.
Figure 14A:
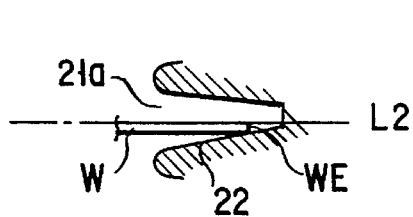
FIGS. 14A and 14B are cross-sectional views respectively taken along the lines XIVA—XIVA and XIVB—XIVB in FIG. 13.
Figure 14B:
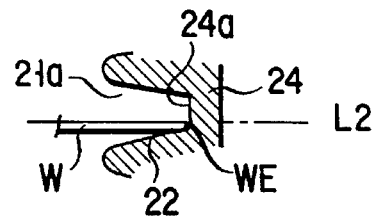

According to a second embodiment shown in FIG. 13, the walls of the container 10 on the sub-opening 13 side are formed as converging walls 24 which converge linearly. In addition, an inner surface 24a of the wall 24, which faces to the groove 21a, is brought into contact with the edge WE of the wafer W, instead of the inner surfaces of the fillings 23. The positions of the inner surface 24a are determined such that the wafer W is completely horizontal when the container 10 is placed on a horizontal plane using the end wall 14 (the first reference plane) as the bottom. More specifically, when the wafer W is held in the slot 21 as shown in FIGS. 10 and 11 and the edge WE of the wafer W abuts on the inner surface 24a of the wall, the wafer W is placed at the same height on portions of the supporting surface 22. For example, the wafer W is placed at the same height on the portions corresponding to the line XIVA—XIVA and the line XIVB—XIVB (FIG. 13), cross-sectional views of which are respectively shown in FIGS. 14A and 14B, so that the upper surface of the wafer W coincides with a level L2. Thus, the wafer W can be placed at the same height of the supporting surface 22, even if the outline of the wafer W and the outline of the supporting surface 22 are not concentric.

Figure 15:
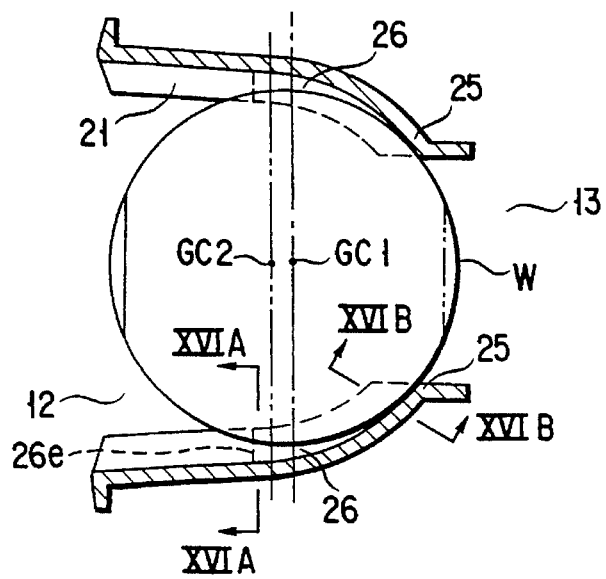
FIG. 15 is a plan view showing a state in which a wafer is contained in the container according to a third embodiment of the present invention.
Figure 17A:
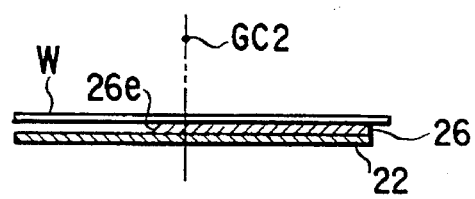
FIG. 17A is a cross-sectional view showing a raising body provided in a groove of the container shown in FIG. 15.

FIG. 15 is a plan view of a slot 21 according to a third embodiment of the present invention. In this embodiment, raising bodies 26 are provided on the supporting surface 22 of each groove 21a, instead of the fillings 23 which are brought into contact with the edge WE of a wafer. As shown in FIG. 17A, the raising bodies 26 continuously extend from portions adjacent to the sub-opening 13 toward the main opening 12 beyond radial extension lines passing through the centers of gravity GC1 and GC2 of a wafer which is in contact with an innermost portion 25 of the side wall of the container 10. GC1 is the center of gravity when the orientation flat of the wafer is located on the main opening 12 side and GC2 is the center of gravity when the orientation flat of the wafer is located on the sub-opening 13 side. Sides 26e of the raising bodies 26 on the main opening 12 side are tapered so that the wafer W can easily be inserted.

Figure 16A:
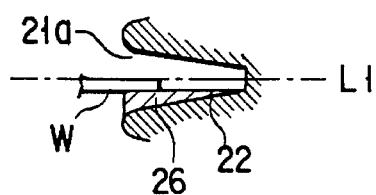
FIGS. 16A and 16B are cross-sectional views respectively taken along the lines XVIA—XVIA and XVIB—XVIB in FIG. 15.
Figure 16B:
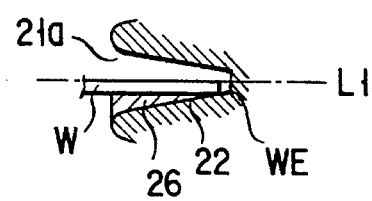

The upper surfaces of the raising bodies 26 are flat and formed in parallel with the first reference plane of the end wall 14. Hence, when the container 10 is placed on a horizontal plane using the end wall 14 as the bottom, the wafer W on the raising bodies 26 is accurately horizontal. More specifically, when the wafer W is stored in the slot 21 and placed on the raising bodies, the upper surface of the wafer W coincides with a level L1 on the portions corresponding to the line XVIA—XVIA and the line XVIB—XVIB (FIG. 15), cross-sectional views of which are respectively shown in FIGS. 16A and 16B.

Figure 17B:
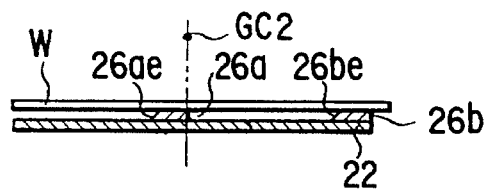
FIG. 17B is a cross-sectional view showing a modification of the raising body.

Each of the raising bodies can be constituted by two portions 26a and 26b, which are arranged at least so that the radial extension line passing through the center of gravity GC2 of the wafer W is interposed therebetween, as shown in FIG. 17B. Sides 26ae and 26be of the portions 26a and 26b on the main opening 12 side are tapered so that the wafer W can easily be inserted. In the structure shown in FIG. 17A, since ruggedness of the upper surfaces of the raising bodies 26 tends to adversely influence the positioning of the wafer, the upper surface is required to be flat with a high accuracy. However, in the structure shown in FIG. 17B, since ruggedness of the upper surfaces of the raising portions 26a and 26b less influences the positioning of the wafer, the accuracy of the flatness of the upper surfaces can be lower and the raising portions can be manufactured easily.

Figure 18:
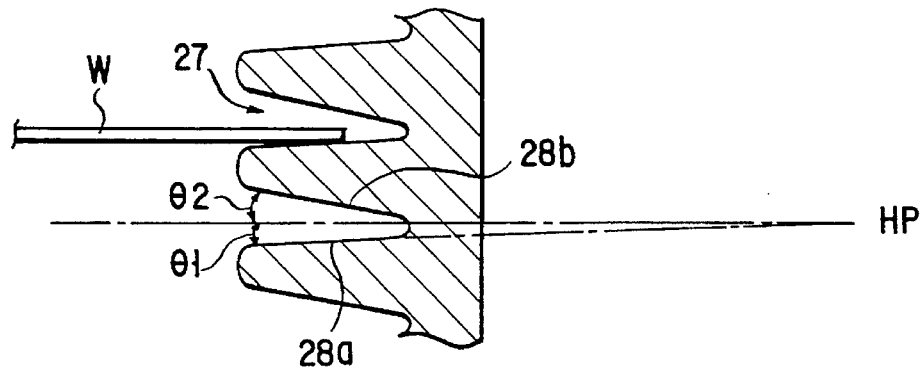
FIG. 18 is an enlarged cross-sectional view showing part of the grooves of the container according to a fourth embodiment of the present invention.

FIG. 18 is a cross-sectional view showing a slot groove 27 according to a fourth embodiment of the present invention. In this embodiment, the entire structure is the same as shown in FIG. 7 except that the direction of the V-shaped groove 27 is slightly different. Hence, only differences between the fourth embodiment and the structure shown in FIG. 7 will be described in the following.

In the fourth embodiment, a supporting surface 28a on which a wafer W is disposed is set to make an angle θ1 of 1° to 3° to a horizontal HP or the first reference plane when the container 10 is placed on a horizontal plane using the end wall 14 having the first reference plane as the bottom, and a ceiling surface 28b is set to make an angle θ2 of 9° to 15° to the horizontal HP or the first reference plane. An angle of the V-shaped groove 27 in its entirety is the same as that in the first to third embodiment, i.e., 12° to 16°.

According to this embodiment, when the container 10 is placed on a horizontal plane using the end wall 14 having the first reference plane as the bottom, the wafer W cannot be placed at the same height of the supporting surface of the slot due to the clearance 7, similarly to the conventional structure shown in FIGS. 3, 4A and 4B. However, since the supporting surface 28a is set to make the small angle θ1 to the horizontal HP, the wafer W is disposed at a very small angle to the horizontal. Hence, the wafer W can be handled with substantially no problem. If the angle θ1 is smaller than about 1°, the wafer W cannot easily be inserted into the slit because of friction between the wafer w and the supporting surface. If the angle θ1 is greater than about 3°, handling of the wafer W accompanies the problems as described in the section of the prior art.

Figure 19:
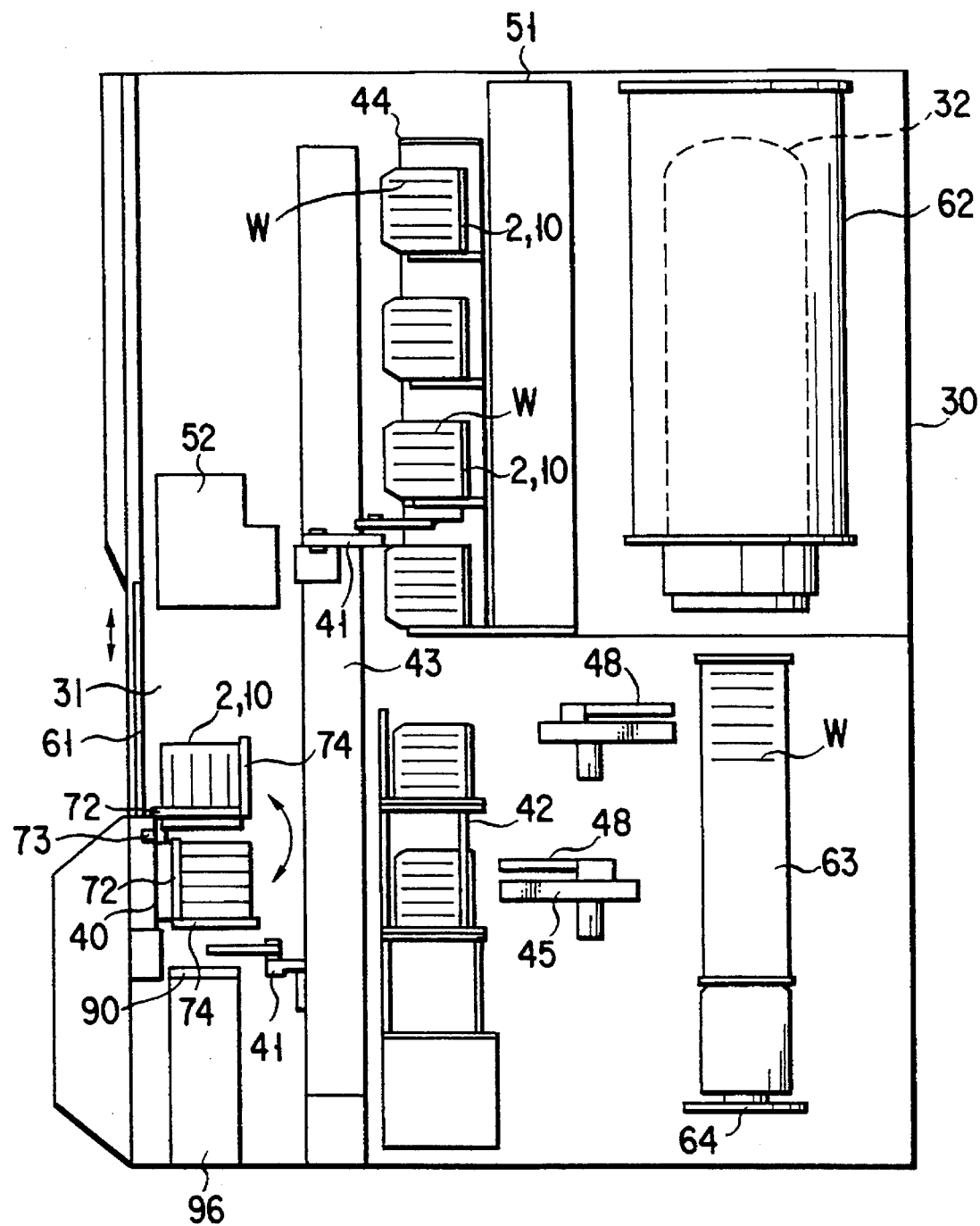
FIG. 19 is a schematic diagram showing a heat treatment system incorporating a wafer aligning apparatus of the present invention.

FIG. 19 is a schematic view of a heat-treatment system for semiconductor wafers, which incorporates a wafer aligning apparatus of the present invention. This aligning apparatus can be utilized to handle not only the containers 10 shown in FIGS. 7 to 18 according to the present invention but also the conventional container 2 shown in FIG. 1.

An inlet/outlet port 31 is formed on one side of a casing 30 of the heat treatment system for carrying containers 2 or 10 in or out of the casing 30. The inlet/outlet port 31 is automatically opened and closed by an auto-door 61. A reaction tube 32 is provided in an upper portion of the innermost part of the casing 30. The reaction tube 32 is covered by a cover 62 incorporating a heater. An elevator 64, arranged under the reaction tube 32, loads or unloads a boat 63 containing wafers w into or out of the reaction tube 32.

Figure 21:
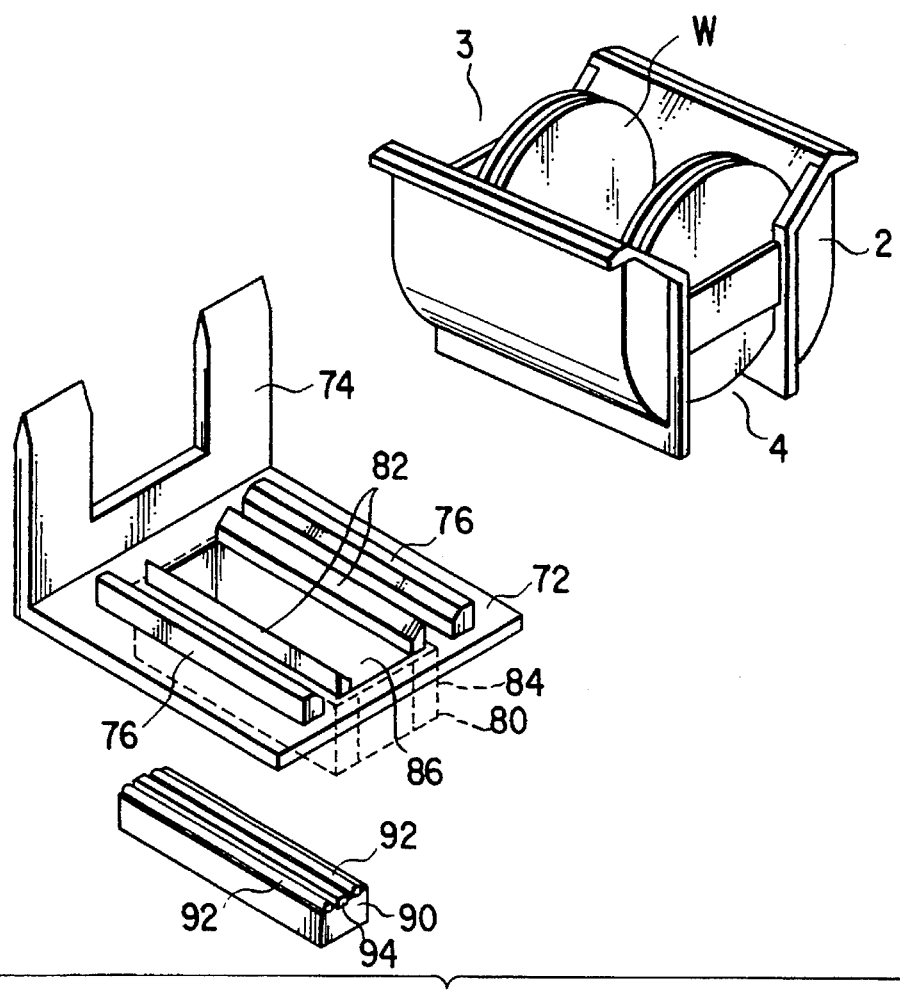
FIG. 21 is a perspective view showing an attitude changing section of the system shown in FIG. 19.

An attitude converting section 40 is arranged near the inlet/outlet port 31 in the casing 30. As shown in FIG. 21, the attitude converting section 40 includes a table 72 on which a container 2 or 10 is to be mounted (in the following, a case where the container 2 is treated will be described). A side wall 74 is formed on a side of the table 72 at right angles thereto and a pair of protruding guides 76 are formed on the table 72. The container 2 is positioned by means of the side wall 74 and the guides 76. An aligning unit 80 (to be described later) is arranged under the table 72.

The container 2, carried into the system through the inlet/outlet port 31, is first mounted on the table 72. At this time, a plurality of wafers W stored in the container 2 are substantially vertical. Then, the table 72 is rotated by 90° downward about an axis 73, with the result that the container 2 is mounted on the side wall 74. In other words, the attitude of the container 2 is approximately 90° converted, thereby making the wafers W substantially horizontal.

Subsequently, the container 2 is transferred by a transferrer 41 to an elevator 43. The elevator 43 transfers the container 2 to an upper stage 44. A filter unit 51 is arranged near the upper stage 44. On the upper stage 44, the wafers W are arranged in parallel to a flux of cleaning air passed through the filter unit 51. The cleaning air removes particles on the wafers W.

Figure 20:
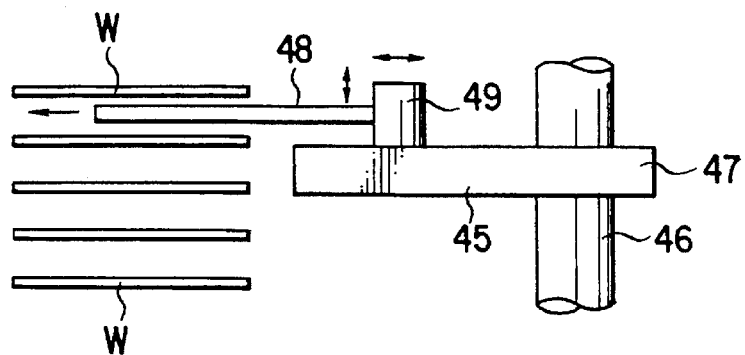
FIG. 20 is a diagram showing a state in which a wafer is to be transferred by a transfer arm of the system shown in FIG. 19.

Thereafter, the container 2 is lowered by the elevator 43 and transferred to a lower stage 42. In a state where the container 2 is mounted on the stage 42, the wafers W in the container 2 is transferred by an arm 48 of a transferrer 45 to the wafer boat 63. As shown in FIG. 20, the transferrer 45 comprises a base portion 47, which is coupled with a supporting rod 46 so as to be movable upward and downward and rotatable. It also comprises a slider 49 which is freely movable on the base portion 47. The arm 48 is supported by the slider 49 so as to be movable upward and downward.

As shown in FIG. 20, to transfer a wafer W, the arm 48 is inserted between two wafers W. Then, the arm 48 is moved upward slightly so as to raise and support the wafer W. In this state, the arm 48 is drawn and the base portion 47 is rotated. Then, the arm 48 faces to the boat 63 and moves forward, thereby transferring the wafer W to the boat 63. At this time, it is preferable that the wafers W are aligned unlike those shown in FIGS. 6A and 6B in order to smoothly insert the arm 48 between wafers.

Figure 22:
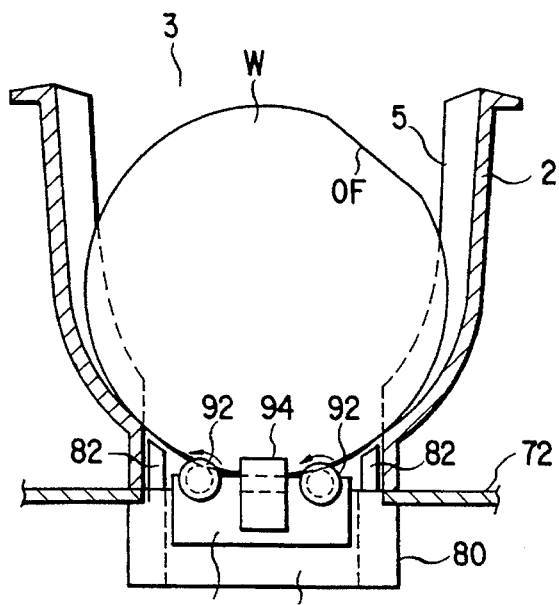
FIG. 22 is a cross-sectional view showing a wafer aligning unit and a counter of the system shown in FIG. 19.

As shown in FIGS. 21 and 22, the aligning unit 80 comprises a pair of pushers 82 extending in parallel with each other to simultaneously press all the wafers W stored in the container 2 through the sub-opening 4. The end surfaces 83 of the pushers 82 are tapered so as to be brought into contact with sides of the wafers on a horizontal plane, when the table 72 is horizontal. The pushers 82 are reciprocated by a driving member 84 incorporated in the unit 80, so that they are moved close to or away from the wafers W. The aligning unit 80 has a central opening 86, through which a wafer counter 90 accesses the wafers W. In other words, the pushers 82 and the driving member 84 are arranged so as not interfere with an operation of the counter 90.

The counter 90 comprises a pair of rollers 92 for rotating the wafers W to align their orientation flats OF on the sub-opening 4 side. After the alignment, the orientation flats OF can be either kept on the sub-opening 4 side or moved to the main opening 3 side.

The counter 90 also comprises optical sensors 94 of the number corresponding to the maximum number of wafers which can be stored in the container 2, to optically detect the number of the wafers W. The counter 90 is moved close to or removed from the table 72 of the attitude converting section 40 by an elevator 96, as shown in FIG. 19.

When the container 2 is carried into the system through the inlet/outlet port 31 and the container 2 is mounted on the table 72 so that the wafers W are substantially vertical, the counter 90 is first moved through the opening 86 of the aligning unit 80 by the elevator 96 and enters the container 2 through the sub-opening 4, as shown in FIG. 22. Then, the orientation flats OF are aligned by the rollers 92 and the number of the wafers is detected by the sensors 94. After the detection of the number of the wafers, the counter 90 is withdrawn downward through the opening 96 of the aligning unit 80.

Next, the pushers 82 of the aligning unit 80 protrude and their end surfaces 83 press the wafers W upward. In this state, i.e., while the end surfaces 83 of the pushers 82 are in contact with the wafers W, the table 72 is 90° rotated downward, with the result that the container 2 is mounted on the side wall 74, as described before.

When the container 2 is disposed on the table 72 such that the wafers W are substantially vertical, the wafers W are brought into contact with the side walls adjacent to the sub-opening 4 or innermost portions of the grooves and supported by them. At this time, the contact portions where the wafers W are in contact with the container 2 are not on a horizontal plane due to less accurate dimensions in manufacturing the container 2. Hence, the sides of the wafers W on the main opening 3 side or the front edges thereof are not aligned.

Figure 6A:
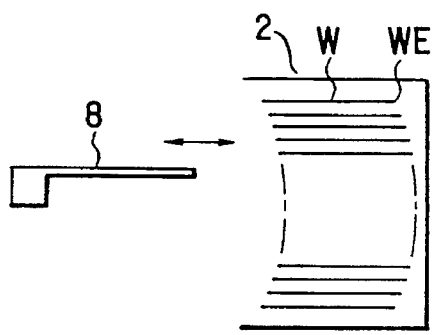
FIGS. 6A and 6B are diagrams showing states in which wafers are transferred into or withdrawn from the container shown in FIG. 1.
Figure 6B:
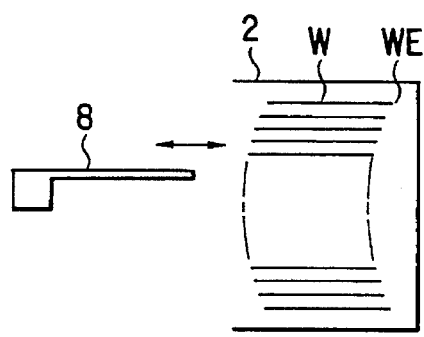

If the container 2 is 90° rotated in this state to make the wafers substantially horizontal, the sides of the wafers W on the main opening 3 side are as shown in FIGS. 6A or 6B. However, according to the present invention, since the wafers w are removed from the inner surfaces of the side walls or innermost portions of the grooves of the container 2 by the pushers 82 and the container 2 is 90° rotated while the front edges being aligned, the sides of the wafers W on the main opening 3 side or the front edges thereof are aligned when the wafers W are placed substantially horizontal.

The pushers 82 can be replaced by protrusions which are fixed relative to the table 72 and are not reciprocated. The protrusions, however, can be arranged to remove the wafers W from the inner surfaces of the side walls or innermost portions of grooves of the container 2 and align the front edges of the wafers when the container 2 is mounted on the table 72. In other words, as long as the wafers W, which are placed substantially vertical in the container 2, are protruded and aligned by pushers or protrusions on the table 72, and the container 2 is 90° rotated in this state, the wafers W can be aligned when they are placed substantially horizontal.

The pushers 82 or fixed protrusions can be formed of silicon carbide (SIC), quartz glass ($SiO_2$), Teflon, polypropylene, or the like. In a case where the container 2 is to store 8-inch wafers, the shifting amount of a wafer protruded by the pushers 82 or fixed protrusions is about 2 mm to 5 mm, in consideration of variation in dimensions of the supporting bottoms of the holding slots 5.

Figure 23A:
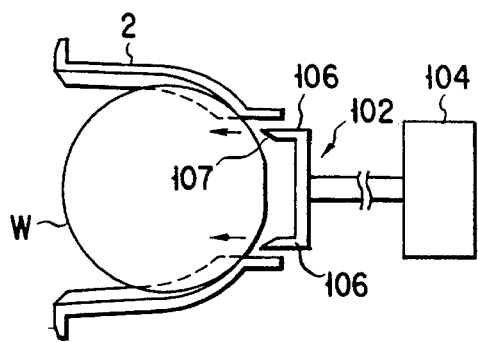
FIGS. 23A and 23B are plan and side views, respectively, showing a modification of the wafer aligning unit.
Figure 24:
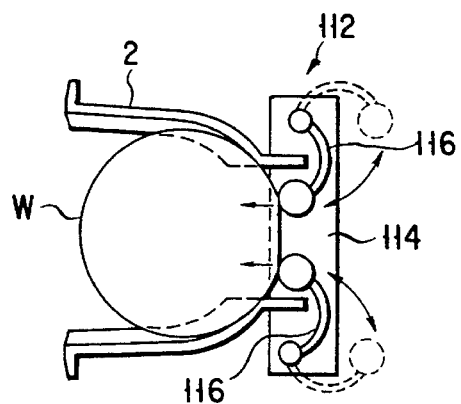
FIG. 24 is a plan view showing another modification of the wafer aligning unit.

FIGS. 23A and 24 show modifications of the wafer aligning unit.

Figure 23B:
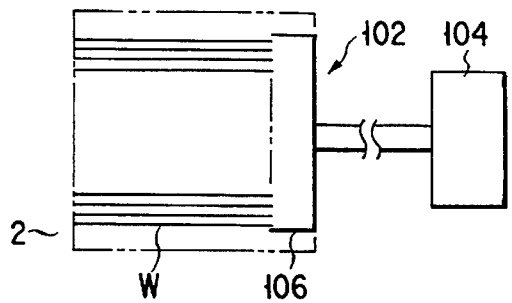

An aligning unit 102 shown in FIG. 23A is operated after the container 2 is 90° attitude-changed so that the wafers w are substantially horizontal. The aligning unit 102 comprises a pair of pushers 106 which can be moved forward and backward by a driving member 104. The end surfaces 107 of the pushers 106 have the same configuration as the end surfaces 83 of the pushers 83. All the wafers W are pushed by the pushers 106 and removed about 2 mm to 5 mm from the side walls on the sub-opening 4 side of the container 2. As a result, as shown in FIG. 23B, the sides of the wafers W on the main opening 3 side or the front edges thereof are aligned.

The container of the present invention can be applied not only to semiconductor wafers but also to quartz wafers for LCD or glass wafers. Further, the aligning mechanism of the present invention can be applied to a wafer manufacturing system, a wafer examination system and a heat treatment system for performing various heat treatment processes such as a process of oxidizing semiconductor wafers, a diffusion process, a CVD process, an annealing process and an etching process.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A container for storing a plurality of substantially circular wafers, comprising:

first and second end walls opposite to each other, the first end wall having a reference plane;

first and second side walls opposite to each other and connecting the first and second end walls;

a first opening defined by the first and second end walls and the first and second side walls, the first opening serving as an opening through which the wafers are inserted in or withdrawn from the container;

a second opening defined by the first and second end walls and the first and second side walls, the second opening being opposite to the first opening and smaller than the first opening;

a plurality of slots for holding the wafers one by one at intervals, each slot including a pair of grooves which are formed in inner surfaces of both the side walls, have a V-shaped cross-section, and divergently open toward a central portion of the container, one of surfaces defining each groove serving as a supporting surface on which a wafer is disposed when the container is positioned such that the reference plane is placed on a horizontal plane, the supporting surfaces of the pair of grooves having a pair of converging portions which converge toward the second opening; and a pair of contact surfaces which are respectively brought into contact with sides of each of the wafers held by the slots, each contact surface being formed on the converging portion of each supporting surface and restricting the position of each wafer so that the wafer is positioned at the same height on the supporting surfaces of the pair of grooves;

wherein a cross-section of said slot at said converging portion which comprises said contact surfaces differs from a cross-section of the slot in a remainder of the slot such that an inclination of the wafer away from the horizontal plane is substantially prevented; and the contact surfaces are formed by filling means.

2. The container according to claim 1, wherein the first and second side walls comprise converging walls which converge toward the second opening and the pair of converging portions of the supporting surfaces are formed on inner surfaces of the converging walls.

3. The container according to claim 2, wherein the filling means comprises a filling which is formed separately from the side walls of the container and provided on the converging portion.

4. An apparatus for simultaneously aligning a plurality of substantially circular wafers stored in a container, the container comprising, first and second end walls opposite to each other, the first end wall having a first reference plane, first and second side walls opposite to each other and connecting the first and second end walls, a first opening defined by the first and second end walls and the first and second side walls, the first opening serving as an opening through which the wafers are inserted in or withdrawn from the container, a second opening defined by the first and second end walls and the first and second side walls, the second opening being opposite to the first opening and smaller than the first opening, a frame formed on both sides of the second opening and having a second reference plane, and a plurality of slots for holding the wafers one by one at intervals, each slot including a pair of grooves which are formed in inner surfaces of both the side walls, have a V-shaped cross-section, and divergently open toward a central portion of the container, one of surfaces defining each groove serving as a supporting surface on which a wafer is disposed substantially horizontal when the container is positioned such that the first reference plane is placed on a horizontal plane, the supporting surfaces of the pair of grooves having a pair of converging portions which converge toward the second opening, and the apparatus comprising:

a first plate, which is brought into contact with the second reference plane, and on which the container is mounted so that the second reference plane is horizontal;

a second plate, which is perpendicular to the first plate, and which faces the first reference plane when the container is mounted on the first plate;

attitude converting means for substantially 90° rotating the first and second plates together, thereby converting a state in which the container is mounted on the first plate into a state in which the container is mounted on the second plate and the first reference plane is horizontal; and restricting means inserted through the second opening into the container and brought into contact with sides of the wafers so as to simultaneously move the wafers toward the first opening, the restricting means being brought into contact with the sides of the wafers on one plane.

5. The apparatus according to claim 4, wherein the restricting means is inserted through the second opening into the container in the state in which the container is mounted on the first plate.

6. The apparatus according to claim 5, wherein the attitude converting means substantially 90° rotates the restricting means together with the first and second plates.

7. The apparatus according to claim 6, wherein the first plate includes a guide for positioning the container.

8. The apparatus according to claim 7, wherein the restricting means comprises a pair of restricting members, each having an end surface which is brought into contact with the sides of the wafers.

9. The apparatus according to claim 8, further comprising a means for moving the restricting means close to and away from the wafers.

10. The apparatus according to claim 8, wherein the restricting means is fixed relative to the first plate.

11. The apparatus according to claim 8, wherein a passage is formed between the pair of restricting members and a counter for counting the number of the wafers approaches the wafers through the passage, when the container is mounted on the first plate.

12. The apparatus according to claim 4, wherein the restricting means is inserted through the second opening into the container, after the first reference plane is horizontal.

* * * * *